(12) United States Patent
Arai et al.

(10) Patent No.: US 8,520,443 B2
(45) Date of Patent: Aug. 27, 2013

(54) NONVOLATILE SEMICONDUCTOR STORAGE DEVICE AND METHOD FOR DRIVING THE SAME

(75) Inventors: Fumitaka Arai, Kanagawa (JP); Wataru Sakamoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,442

(22) Filed: Sep. 21, 2011

(65) Prior Publication Data

US 2012/0069678 A1    Mar. 22, 2012

(30) Foreign Application Priority Data

Sep. 22, 2010   (JP) ................ 2010-212848

(51) Int. Cl.
    *G11C 11/34*  (2006.01)
(52) U.S. Cl.
    USPC ............................ 365/185.23; 365/185.24
(58) Field of Classification Search
    USPC ........................ 365/185.23, 185.24
    See application file for complete search history.

(56) References Cited

U.S. PATENT DOCUMENTS

| 7,505,312 | B2 | 3/2009 | Matsunaga et al. |
| 7,859,898 | B2 | 12/2010 | Sato et al. |
| 2009/0190399 | A1* | 7/2009 | Shibata et al. ........... 365/185.03 |
| 2010/0332946 | A1* | 12/2010 | Lee et al. .................... 714/763 |
| 2011/0069542 | A1* | 3/2011 | Sato et al. ............... 365/185.02 |
| 2012/0069669 | A1 | 3/2012 | Sakamoto et al. |

FOREIGN PATENT DOCUMENTS

| JP | 2004-319007 | 11/2004 |
| JP | 2005-530362 | 10/2005 |
| JP | 2009-38382 | 2/2009 |
| JP | 2009-252293 | 10/2009 |
| JP | 2009-272016 | 11/2009 |
| JP | 2010-192049 | 9/2010 |
| WO | WO 2004/001852 A1 | 12/2003 |

* cited by examiner

*Primary Examiner* — Michael Tran
(74) *Attorney, Agent, or Firm* — Oblon, Spivak, McClelland, Maier & Neustadt, L.L.P.

(57) ABSTRACT

A storage device according to one embodiment includes memory cells which are connected in series in a first direction and are arranged in a matrix by the arranged series connections, and word lines which connect control gates of the memory cells in a second direction perpendicular to the first direction, in which a first interval and a second interval wider than that are alternately repeated for intervals in the second direction between the memory cells. The storage device according to the embodiment comprises a drive unit for writing data in a first cell, then writing data in a second cell which is connected to the same word line as the first cell and is spaced at the first interval in the second direction, then reading the data in the second cell, and reading the data in the first cell with correction based on the read value of the second cell.

16 Claims, 10 Drawing Sheets

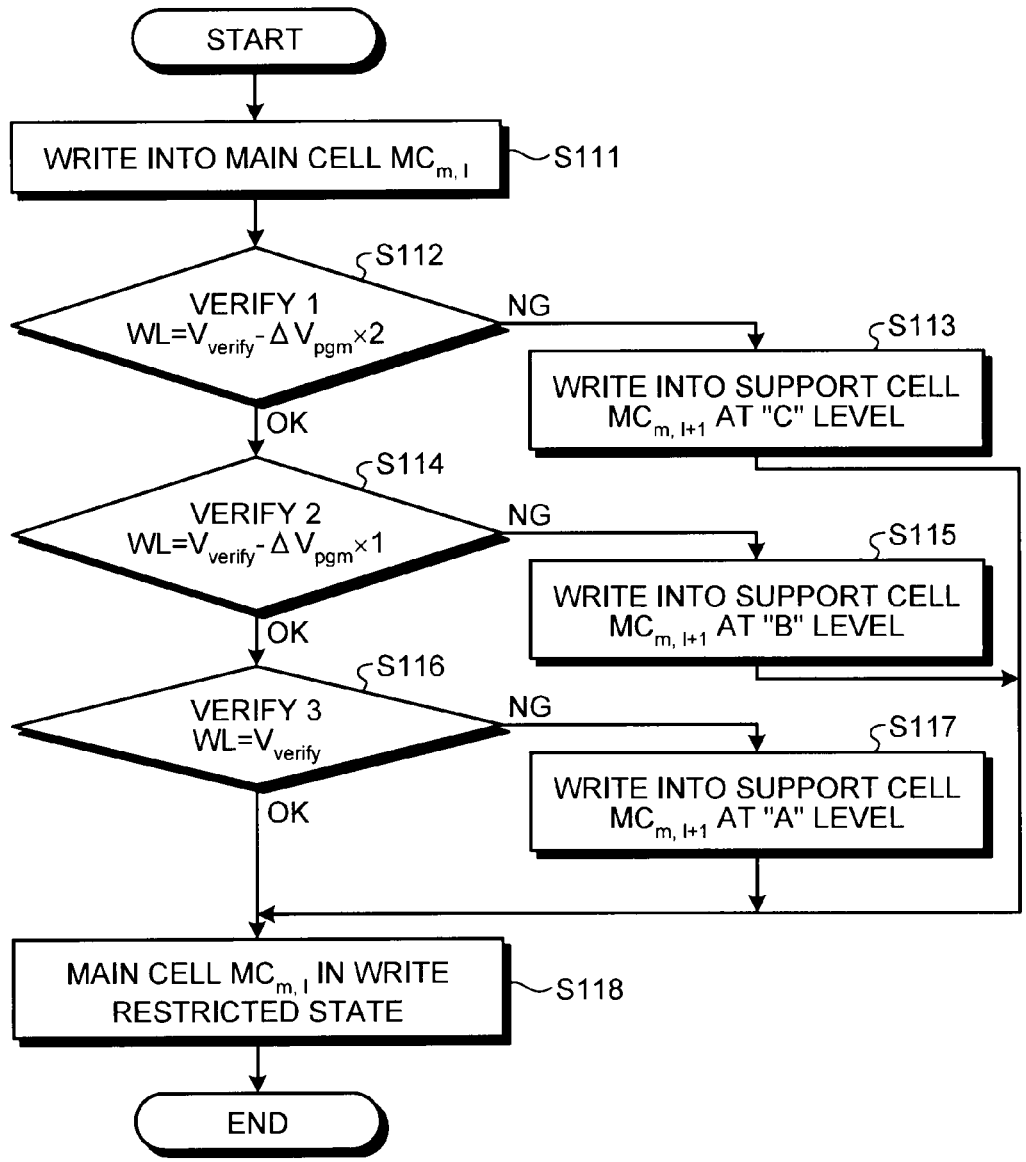

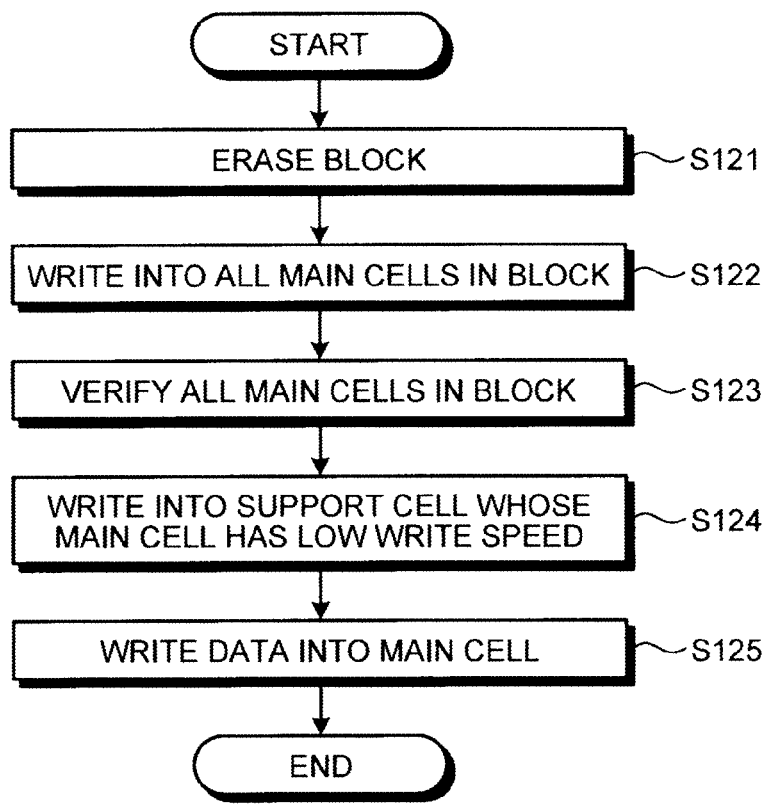

NONVOLATILE SEMICONDUCTOR STORAGE DEVICE AND METHOD FOR DRIVING THE SAME

CROSS-REFERENCE TO RELATED APPLICATIONS

This application is based upon and claims the benefit of priority from the prior Japanese Patent Application No. 2010-212848, filed on Sep. 22, 2010; the entire contents of which are incorporated herein by reference.

FIELD

Embodiments relate generally to a nonvolatile semiconductor storage device and a method for driving the same.

BACKGROUND

A nonvolatile semiconductor storage device such as EEPROM NAND flash memory is increasingly miniaturized. Thus, an interval between adjacent memory cells is remarkably narrow. When the interval between adjacent memory cells is narrower, a capacity (FG-FG capacity) between floating gates (FG) of the adjacent cells increases. Therefore, there is a problem that a threshold voltage Vth of a previously-written memory cell varies by the FG-FG capacity depending on data in a later-written adjacent cell. This is called proximity effect. Particularly, a multivalued memory for storing N bit data (N≧2) in one memory cell needs to remarkably narrow a distribution of threshold voltage per data. Therefore, the problem on the proximity effect is noted in the multivalued memory.

When the proximity effect is large as described above, a read system for correcting the proximity effect may be employed. For example, when data is read from a memory cell connected to a select word line WLn, the data in the select word line WLn is corrected and read for cancelling the proximity effect based on data written in a memory cell connected to an adjacent word line WLn+1. In other words, a DLA (Direct Look Ahead) system for reading data at a shifted read level is employed.

BRIEF DESCRIPTION OF THE DRAWINGS

FIG. 11 is a flowchart illustrating the method for driving the nonvolatile semiconductor storage device according to the embodiment; and FIG. 12 is a flowchart illustrating the method for driving the nonvolatile semiconductor storage device according to the embodiment.

DETAILED DESCRIPTION

A nonvolatile semiconductor storage device according to one embodiment includes nonvolatile memory cells which are connected in series in a first direction and are arranged in a matrix by the arranged series connections, and word lines which connect control gates of the memory cells in a second direction perpendicular to the first direction, wherein a first interval and a second interval wider than the first interval are alternately repeated for intervals in the second direction between the memory cells. The nonvolatile semiconductor storage device according to the embodiment comprises a drive unit for writing data in a first memory cell, then writing data in a second memory cell which is connected to the same word line as the first memory cell and is spaced at the first interval in the second direction, then reading the data in the second memory cell, and reading the data in the first memory cell with correction based on the read value of the second memory cell.

The nonvolatile semiconductor storage device and the method for driving the same according to the embodiments will be described below in detail with reference to the accompanying drawings. The present invention is not limited to the following embodiments.

First Embodiment

Figure 1:
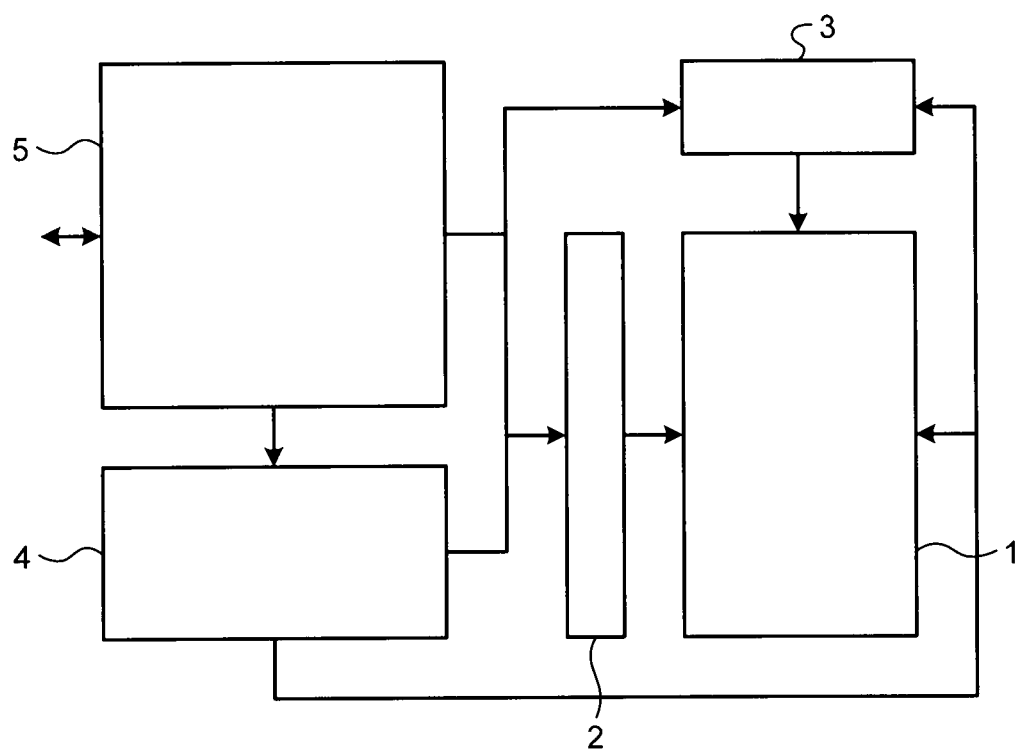
FIG. 1 is a functional block diagram of a NAND flash memory according to an embodiment.

FIG. 1 is diagram illustrating a functional block structure of a NAND flash memory according to a first embodiment. A plurality of memory cells are arranged in an array in a memory cell array 1. A row decoder 2 is provided for selecting and driving word lines and select gate lines provided in the memory cell array 1. A column decoder 3 is provided for selecting bit lines provided in the memory cell array 1.

A high voltage generating unit 4 is provided for increasing a power supply voltage supplied from the outside when performing read, write or erase on the memory cells in the memory cell array 1. A control unit 5 is provided for controlling the row decoder 2, the column decoder 3 and the high voltage generating unit 4, and via the components, controlling the memory cell array 1. The control unit 5 is provided for inputting/outputting data and commands into/from the outside of the NAND flash memory.

Figure 2:
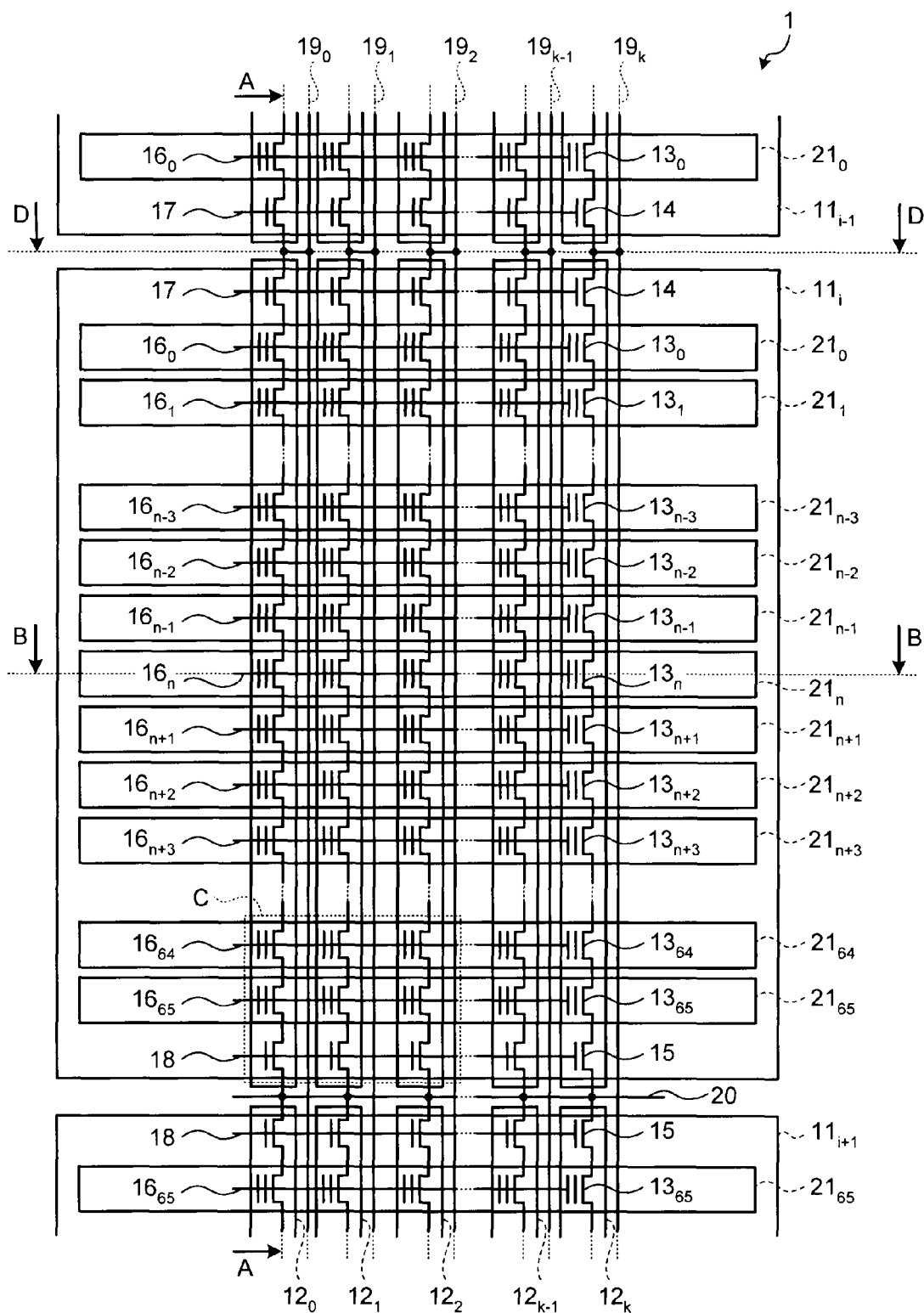
FIG. 2 is a diagram illustrating part of a circuit structure of a memory cell array according to the embodiment.

FIG. 2 is a diagram illustrating part of a circuit structure of the memory cell array 1. The memory cell array 1 comprises a plurality of blocks 11. FIG. 2 illustrates an arbitrary i-th block $11_i$ and part of its adjacent blocks $11_{i-1}$ and $11_{i+1}$.

The blocks 11 each comprise a plurality of NAND cell units 12. One block 11 can include 0 to k NAND cell units 12. For example, k is 4223.

The NAND cell units 12 each comprise a plurality of memory cells 13. The memory cells 13 are provided for storing data. One NAND cell unit 12 can include 0 to 65 memory cells 13.

Sources and drains of the memory cells 13 are interconnected in series. Dummy cells for storing invalid data therein may be used for one to three memory cells from either end of the series-connected memory cells 13 (in FIG. 2, $13_0$ and $13_{65}$ are for one dummy cell, respectively, and $13_{0-2}$ and $13_{63-65}$ are for three dummy cells, respectively).

The NAND cell units 12 each comprise select gate transistors 14, 15. The select gate transistor 14 is connected to the drain side end of the series-connected memory cell 13 in series. The select gate transistor 15 is connected to the source side end of the series-connected memory cell 13 in series. The NAND cell unit 12 is selected by the select gate transistors 14, 15.

CGs (control gate) of the memory cells 13 are commonly connected to any of word lines 16. Specifically, the memory cells 13, which are arranged in a direction (column direction: second direction) perpendicular to a series direction (row direction: first direction) in the NAND cell unit 12, among the memory cells 13 arranged in the matrix are connected to the common word lines 16. Consequently, the parts of the word lines 16 corresponding to the memory cells 13 function as the CG.

Thus, when the memory cells $13_0$ to $13_{65}$ are connected in series, for one block 11, k+1 memory cells 13 are commonly connected to the 66 word lines $16_0$ to $16_{65}$, respectively.

One page 21 has the memory cells 13 connected to the word lines $16_0$ to $16_{65}$, respectively. The page 21 includes the memory cells 13 for the number of (k+1, in FIG. 2) NAND cell units in one block. In the case of k=4223, for example, 4096 memory cells can be used for storage areas and 128 memory cells can be used for redundancy areas and other areas.

The gate of the select gate transistor 14 is commonly connected to a select gate line 17. The drain of the select gate transistor 14 is connected to any of bit lines $19_0$ to $19_k$.

The gate of the select gate transistor 15 is commonly connected to a select gate line 18. The source of the select gate transistor 15 is connected to a source line 20. The source line 20 is shared between the adjacent blocks in the row direction. In the example of FIG. 2, for example, the source line 20 is shared between the blocks $11_i$ and $11_{i+1}$.

Figure 3:
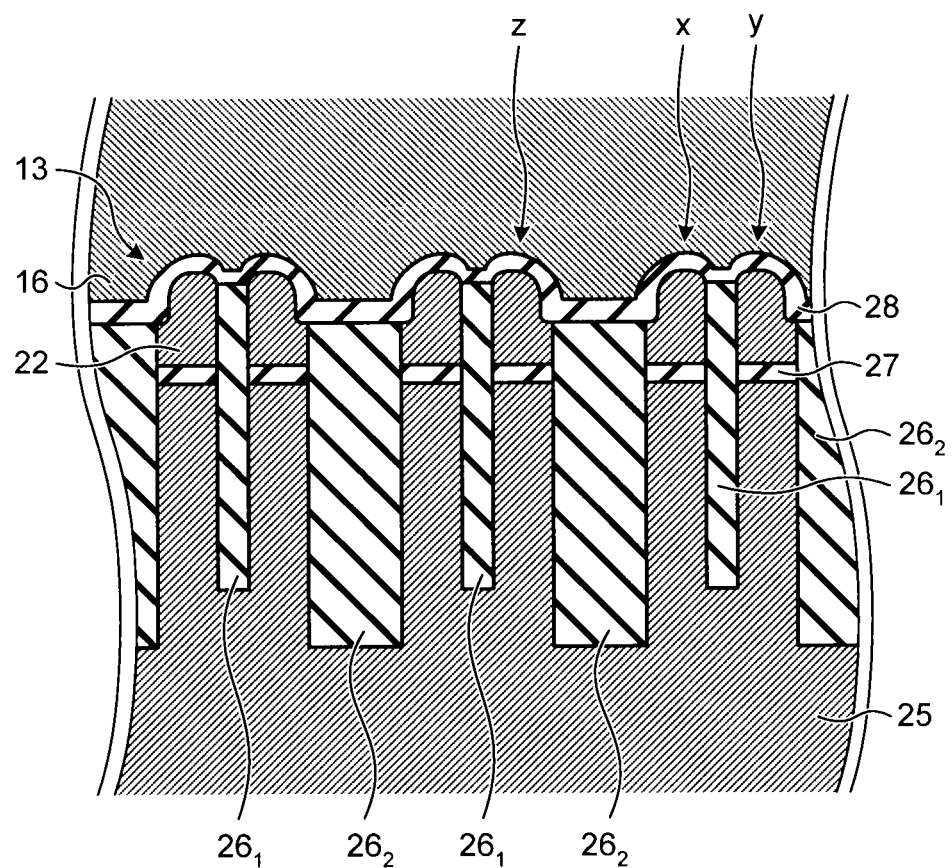
FIG. 3 is a diagram illustrating a structure at B-B cross-section of FIG. 2.

FIG. 3 is a schematic diagram illustrating a structure at B-B cross-section of FIG. 2. In FIG. 3, the six memory cells 13 at B-B cross-section are illustrated and the top and rear surfaces of the semiconductor storage device, which are not directly required for the explanation, are omitted.

The memory cells 13 are electrically separated from each other by device isolation insulating layers 26. In the embodiment, the device isolation has a STI structure. The device isolation insulating layers 26 may employ a silicon oxide film stacked in a trench formed in a semiconductor substrate 25, for example.

The device isolation layer 26 is such that a first device isolation layer $26_1$ and a second device isolation layer $26_2$, which are different in width in the second direction, are alternately repeated in the second direction. The width in the second direction of the second device isolation layer $26_2$ is larger than that of the first device isolation layer $26_1$. In other words, the interval in the second direction between the memory cells 13 is such that the first interval corresponding to the width of the first device isolation layer $26_1$ and the second interval corresponding to the width of the second device isolation layer $26_2$ are alternately repeated. That is, the first interval between the memory cells x and y is smaller than the second interval between the memory cells x and z in FIG. 3.

The first device isolation layer $26_1$ is larger in height than the second device isolation layer $26_2$. The heights of the first device isolation layer $26_1$ and the second device isolation layer $26_2$ are more than the top surface of a tunnel insulating film 27.

The height of the second device isolation layer $26_2$ is less than the highest part in the top surface of the FG 22. Thus, the part functioning as the CG, which is part of the word line 16, is embedded between the FGs 22 at the part corresponding to the width of the second device isolation layer $26_2$.

As illustrated in FIG. 3, in the nonvolatile semiconductor storage device according to the embodiment having the structure in which the first interval and the second interval wider than the first interval are alternately repeated for the intervals between the memory cells in the word line direction (second direction), the influences by the above proximity effect are limited. In other words, the cell x has to consider the influences of the proximity effect mainly for the cell y whose intermediate device isolation layer has a narrower width, and can substantially ignore the influences on the cell z whose device isolation layer has a larger width. This is equally applicable to the cell y and the proximity effect from the cell x has to be considered mainly.

Figure 4:
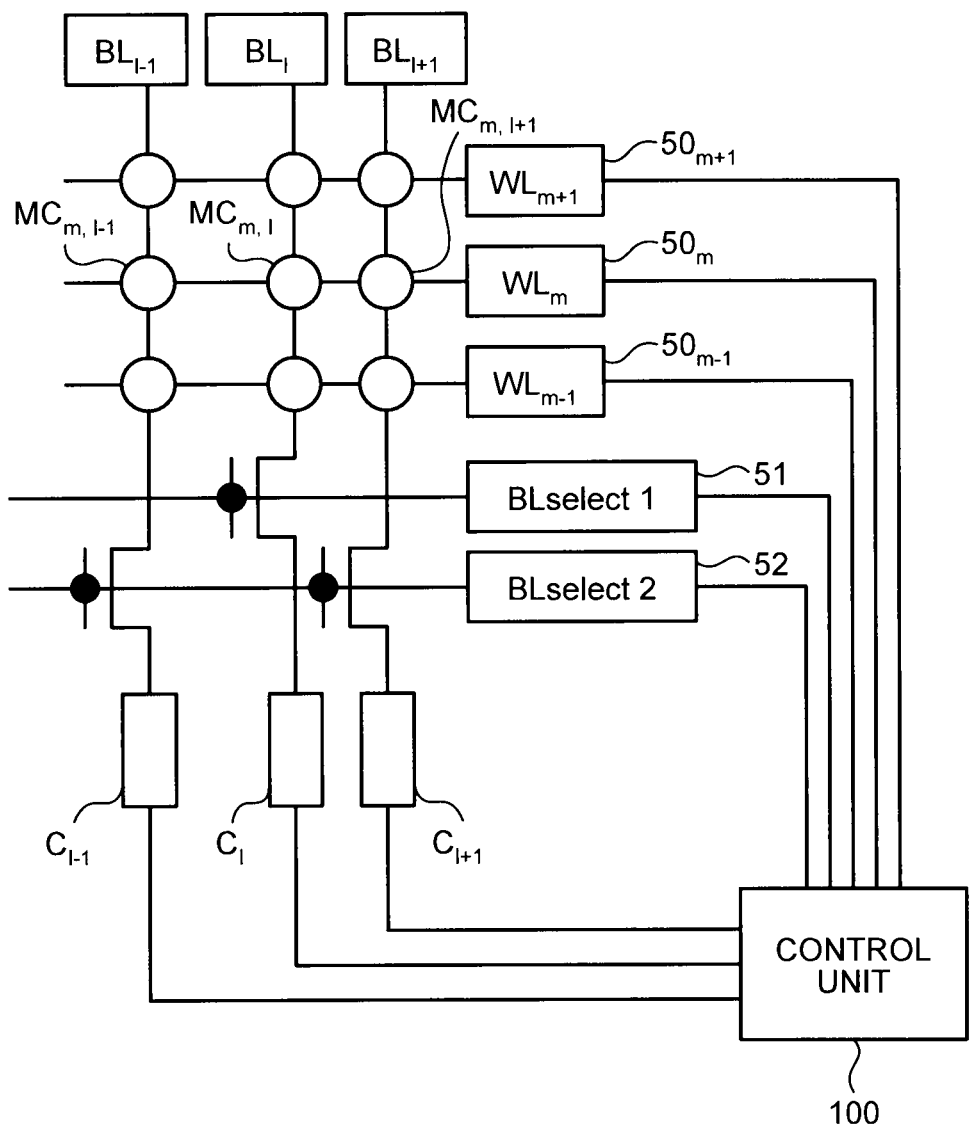
FIG. 4 is a simplified diagram illustrating part of a cell arrangement of a nonvolatile semiconductor storage device and a drive unit according to the embodiment.

In terms of this point, FIG. 4 illustrates part of the cell arrangement of the nonvolatile semiconductor storage device and the drive unit according to the embodiment in a simplified manner. For example, the interval between memory cells $MC_{m,l}$ and $MC_{m,l+1}$ on the word line $WL_m$ is narrower than the interval between the memory cells $MC_{m,l}$ and $MC_{m,l-1}$. In the embodiment, with the control of BL select circuits 51 and 52, on the same word line, data is written into the memory cells on the bit line $BL_l$ and then data is written into the memory cells on the bit lines $BL_{l+1}$ and $BL_{l-1}$. This is achieved by the control in which data is alternately written into the even-numbered bit lines and the odd-numbered bit lines.

Figure 5:
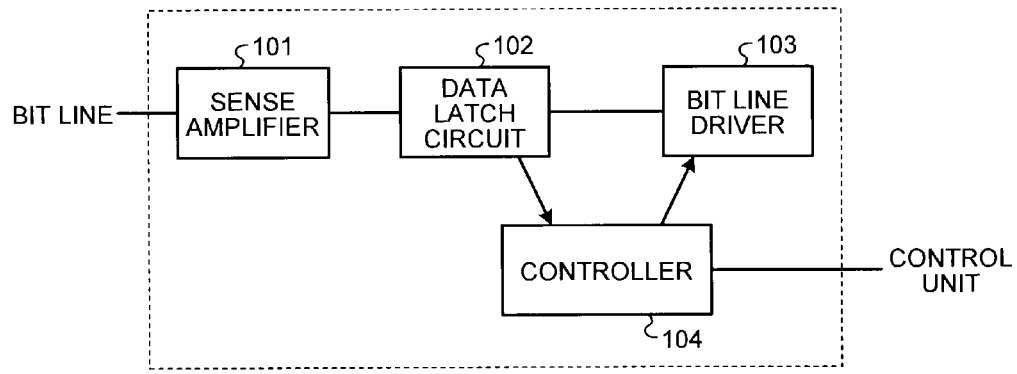
FIG. 5 is a diagram illustrating a structure of a bit line drive unit in the memory cell array according to the embodiment.

Bit line drive units $C_{l-1}$, $C_l$, $C_{l+1}$ are connected to the tips of the bit lines $BL_{l-1}$, $BL_l$, $BL_{l+1}$, respectively, and as illustrated in FIG. 5, the bit line drive units $C_{l-1}$, $C_l$, $C_{l+1}$ are each configured of a sense amplifier 101 which is connected to a bit line and is directed for amplifying a signal and measuring a potential, a data latch circuit 102 for latching an output of the sense amplifier 101 and deciding a state of the memory cells during read, a bit line driver 103 for driving a potential of a bit line and a controller 104 for sending a correction instruction to the bit line driver 103 based on output from the data latch circuit 102. The controller 104 is further connected to an external control unit 100.

The bit line drive units $C_{l-1}$, $C_l$, $C_{l+1}$, the bit line select units 51, 52, and the word line drive units $50_{m-1}$, $50_m$, $50_{m+1}$ are connected to the controller 100, respectively, and the above drive control is conducted by the controller 100.

Figure 6:
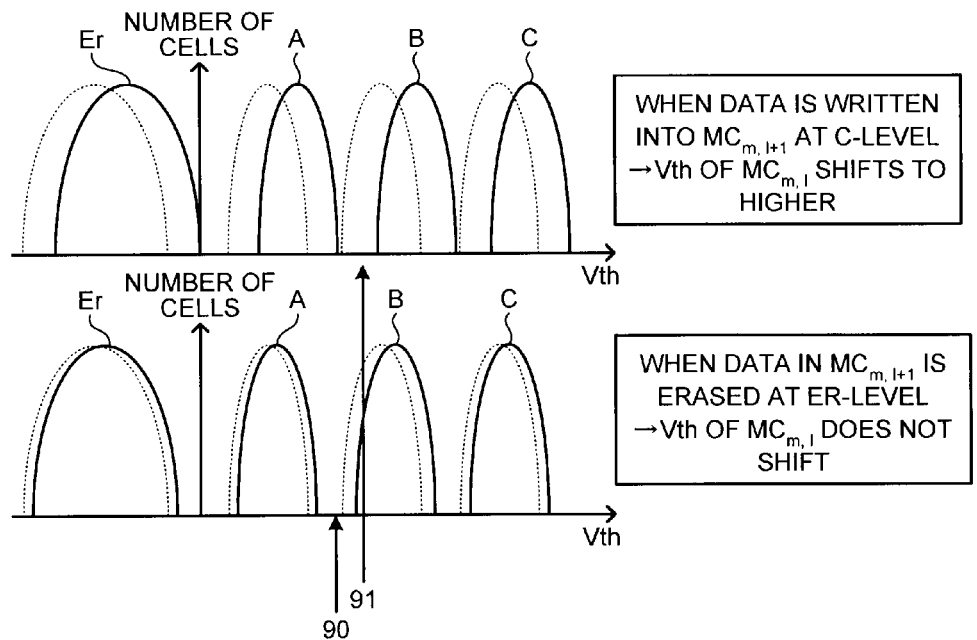
FIG. 6 is a diagram illustrating how a threshold of a first memory cell changes before and after data is written into a second memory cell with respect to a variation characteristic distribution per cell according to the embodiment.

It is assumed that the number of levels of Vth of each cell is four levels (two bits) "Er", "A", "B" and "C", data is first written into the memory cell $MC_{m,l}$ at any level of "Er", "A", "B", "C", and then data is written into the adjacent memory cell $MC_{m,l+1}$ at "Er" or "C." FIG. 6 illustrates how the threshold $V_{th}$ of the memory cell $MC_{m,l}$ changes before and after the write into the memory cell $MC_{m,l+1}$ with respect to a variation characteristic distribution per cell. The lower part of FIG. 6 indicates a change when the memory cell $MC_{m,l+1}$ remains at the erase level "Er" and the upper part of FIG. 6 indicates a change when data is written into the memory cell $MC_{m,l+1}$ at the "C" level. The dotted line indicates a distribution of the threshold Vth of the memory cell $MC_{m,l}$ before the write into the memory cell $MC_{m,l+1}$ and the solid line indicates a distribution of the threshold Vth of the memory cell $MC_{m,l}$ after the write into the memory cell $MC_{m,l+1}$ in the upper and lower parts of FIG. 6.

As can be seen from FIG. 6, although when the memory cell $MC_{m,\,l+1}$ remains at the erase level "Er", the distribution of the threshold Vth of the memory cell $MC_{m,\,l}$ hardly changes, and when data is written into the memory cell $MC_{m,\,l+1}$ at the "C" level, the distribution of the threshold Vth of the memory cell $MC_{m,\,l}$ entirely shifts to higher. Thus, a read potential of the word line for identifying whether the memory cell $MC_{m,\,l}$ is at the "A" level or the "B" level remains at the read potential 90 when the memory cell $MC_{m,\,l+1}$ remains at the erase level "Er", but is corrected to be as high as the read potential 91 in the embodiment when data is written into the memory cell $MC_{m,\,l+1}$ at the "C" level. Thus, the appropriate reading is enabled in consideration of the proximity effect. Additionally, when data is written into the memory cell $MC_{m,\,l+1}$ at the "A" or "B" level, the correction amount of the read potential is smaller. Data is written into the memory cell $MC_{m,\,l+1}$ under the influence of the proximity effect from the memory cell $MC_{m,\,l}$ after data is written into the memory cell $MC_{m,\,l}$, and thus the written value remains and the correction is not needed during the reading.

Figure 7:
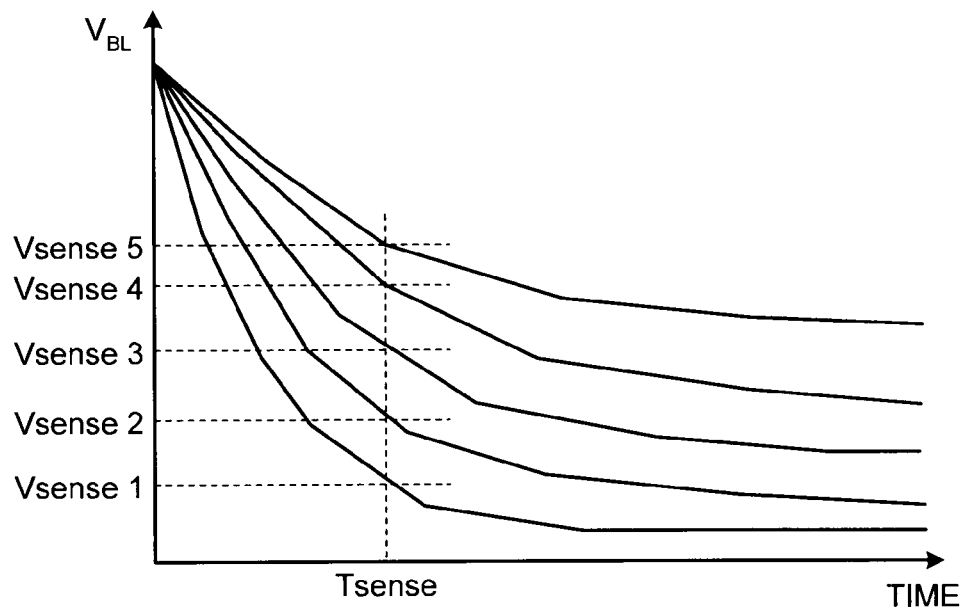
FIG. 7 is a diagram illustrating a temporal transition of a cell current passing in a select cell during read according to the embodiment.

FIG. 7 is a diagram illustrating a temporal transition of a cell current passing in the select cell during the reading. The embodiment is applicable to a case where the threshold of the select cell is detected based on the potential $V_{BL}$ of the bit line after an elapse of predetermined time $T_{sense}$ in the verify operation.

FIG. 7 illustrates a temporal transition of the cell current for five cases $V_{verify}-\Delta V_{pgm}\times 4$, $V_{verify}-\Delta V_{pgm}\times 3$, $V_{verify}-\Delta V_{pgm}\times 2$, $V_{verify}-\Delta V_{pgm}\times 1$ and $V_{verify}$ from the lower threshold of the memory cell $MC_{m,\,l}$ in the absence of the proximity effect. The thresholds serve as a border for deciding the four levels "Er", "A", "B" and "C." The bit line BL is connected with a circuit (such as the circuit illustrated in FIG. 5) for storing the potential of the bit line after an elapse of predetermined time $T_{sense}$.

The bit line potentials $V_{BL}$ at time $T_{sense}$ after the discharge for the respective thresholds are assumed as $V_{sense1}$, $V_{sense2}$, $V_{sense3}$, $V_{sense4}$ and $V_{sense5}$ corresponding to the thresholds $V_{verify}-\Delta_{pgm}\times 4$, $V_{verify}-\Delta V_{pgm}\times 3$, $V_{verify}-\Delta V_{pgm}\times 2$, $V_{verify}-\Delta V_{pgm}\times 1$ and $V_{verify}$, respectively. Since the cell currents correspond to the discharge characteristics of the bit lines one to one, the threshold of the select cell can be decided from the bit line potential $V_T$ after the discharge. The bit line potential $V_{BL}$ after the discharge at time $T_{sense}$ is measured, and it is decided that the threshold is at the "Er" level for $V_{sense1} \leq V_{BL} < V_{sense2}$, at the "A" level for $V_{sense2} \leq V_{BL} < V_{sense3}$, at the "B" level for $V_{sense3} \leq V_{BL} < V_{sense4}$, and at the "C" level for $V_{sense4} \leq V_{BL} < V_{sense5}$, respectively. In the embodiment, for the threshold decision of the memory cell $MC_{m,\,l}$, $V_{sense1}$, $V_{sense2}$, $V_{sense3}$, $V_{sense4}$ and $V_{sense5}$ are corrected from the highest value depending on the value written in the memory cell $MC_{m,\,l+1}$. Similar to the correction of the read potential of the word line described in FIG. 6, when the value written into the memory cell $MC_{m,\,l+1}$ is at the "C" level, the largest correction amount is given, and when the value is at the "A" and "B" levels, the smaller correction amount is given.

Figure 8:
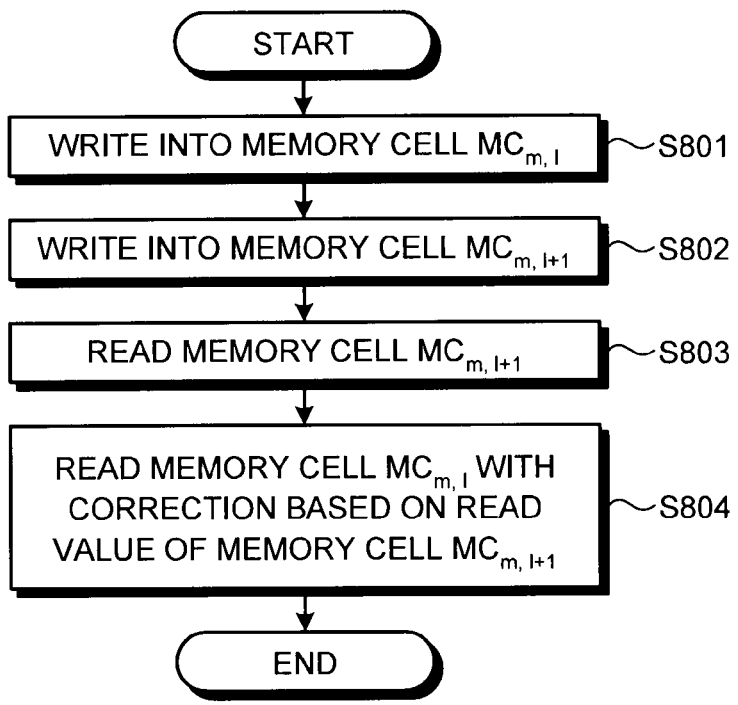
FIG. 8 is a flowchart illustrating a method for driving the nonvolatile semiconductor storage device for read according to the embodiment.

FIG. 8 is a flowchart of a read driving method according to the embodiment. First, data is written into the first memory cell $MC_{m,\,l}$ (step S801). Thereafter, data is written into the second memory cell $MC_{m,\,l+1}$ which is connected to the same word line as the first memory cell $MC_{m,\,l}$ and is spaced at an interval narrower than the memory cell $MC_{m,\,l-1}$ in the word line direction (step S802). Then, the data in the second memory cell $MC_{m,\,l+1}$ is read (step S803) and the data in the first memory cell $MC_{m,\,l}$ is read in the above method with correction based on the read value of the second memory cell $MC_{m,\,l+1}$ (step S804). The control unit 100 controls the bit line drive units $C_{l-1}$, $C_l$, $C_{l+1}$, the bit line select unit 51, 52, and the word line drive units $50_{m-1}$, $50_m$, $50_{m+1}$ so that the driving method is performed.

Figure 9:
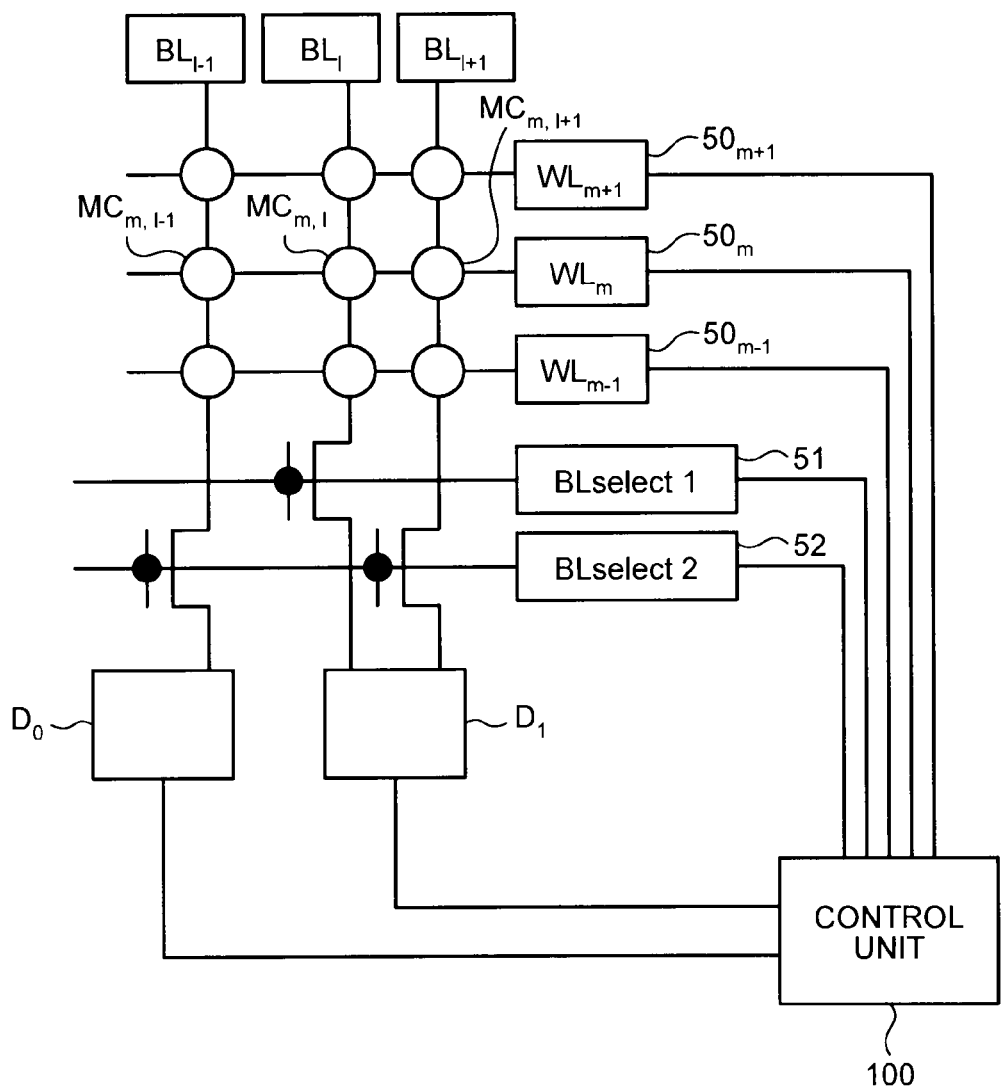
FIG. 9 is a simplified diagram illustrating part of the cell arrangement of the nonvolatile semiconductor storage device and the drive unit according to the embodiment.

FIG. 4 illustrates the example in which the bit line drive units $C_{l-1}$, $C_l$, $C_{l+1}$ are provided for the bit lines $BL_{l-1}$, $BL_l$, $BL_{l+1}$, respectively. However, in the embodiment, since the data in the first memory cell $MC_{m,\,l}$ is corrected and read based on the read value of the second memory cell $MC_{m,\,l+1}$ by the narrower interval between the bit lines $BL_l$ and $BL_{l+1}$ than the interval between the bit lines $BL_l$ and $BL_{l-1}$, it is more efficient that the bit line drive units connected to the bit lines $BL_l$ and $BL_{l+1}$ are shared as the bit line drive unit $D_1$ as illustrated in FIG. 9 to make the correction. Thereby, the hardware can be reduced in size.

In this case, the structure of the bit line drive unit $D_1$ is basically the same as FIG. 5, but both the bit lines $BL_l$ and $BL_{l+1}$ are connected to the sense amplifier 101, the value read from the second memory cell $MC_{m,\,l+1}$ in step S803 in the flowchart of FIG. 8 is latched by the data latch circuit 102, and the controller 104 reading the fact instructs the correction amount to the bit line driver 103. The bit line driver 103 corrects the data in the first memory cell $MC_{m,\,l}$ by the instructed correction amount, and reads it (step S804).

In the cell structure in which the memory cells are arranged at the same interval on the same word line, the correction has not conventionally been made for reading the thresholds of the memory cells in the word line direction because the write order is not defined and because it is not possible to identify which of the memory cells at both sides on the same word line largely influences. However, in the structure of the nonvolatile semiconductor storage device in which paired cells are configured at non-uniform intervals as illustrated in FIG. 3 according to the embodiment, if the write order is defined, the proximity effect can be corrected as described above. In the embodiment, there has been described the case in which each memory cell can take the four levels (2 bits), but each memory cell can be corrected similarly both for two levels (1 bit) and for more than four levels. A conventional DLA can be used for the correction when data is written into a new word line after the correction is made on one word line.

Second Embodiment

A functional block structure of a NAND flash memory and part of a circuit structure of a memory cell array according to a second embodiment are illustrated in FIGS. 1 and 2 similar to the first embodiment. The structure at B-B cross-section in FIG. 2 is the same as FIG. 3. Thus, a narrow interval between the memory cells in the word line direction (second direction) has only to be considered for the proximity effect, and the second embodiment will be described with reference to FIG. 4 similar to the first embodiment.

In the embodiment, the memory cell $MC_{m,\,l}$ and the memory cell $MC_{m,\,l+1}$ are paired and only one of the pair actually functions as a memory cell. For example, the memory cell connected to the even-numbered or odd-numbered arranged bit lines functions as a memory cell actually holding data (which will be referred to as main cell below). The other memory cell of the pair which is connected to the bit line adjacent to the bit line connected with the main cell and is connected to the same word line as the main cell serves as a support cell. The support cell uses the proximity effect to add offset to the threshold of the main cell with a low write speed, thereby enhancing the write speed of the main cell. For example, it is assumed that the memory cell $MC_{m,l}$ is the main cell and the memory cell $MC_{m,l+1}$ is the support cell in FIG. 4.

Figure 10:
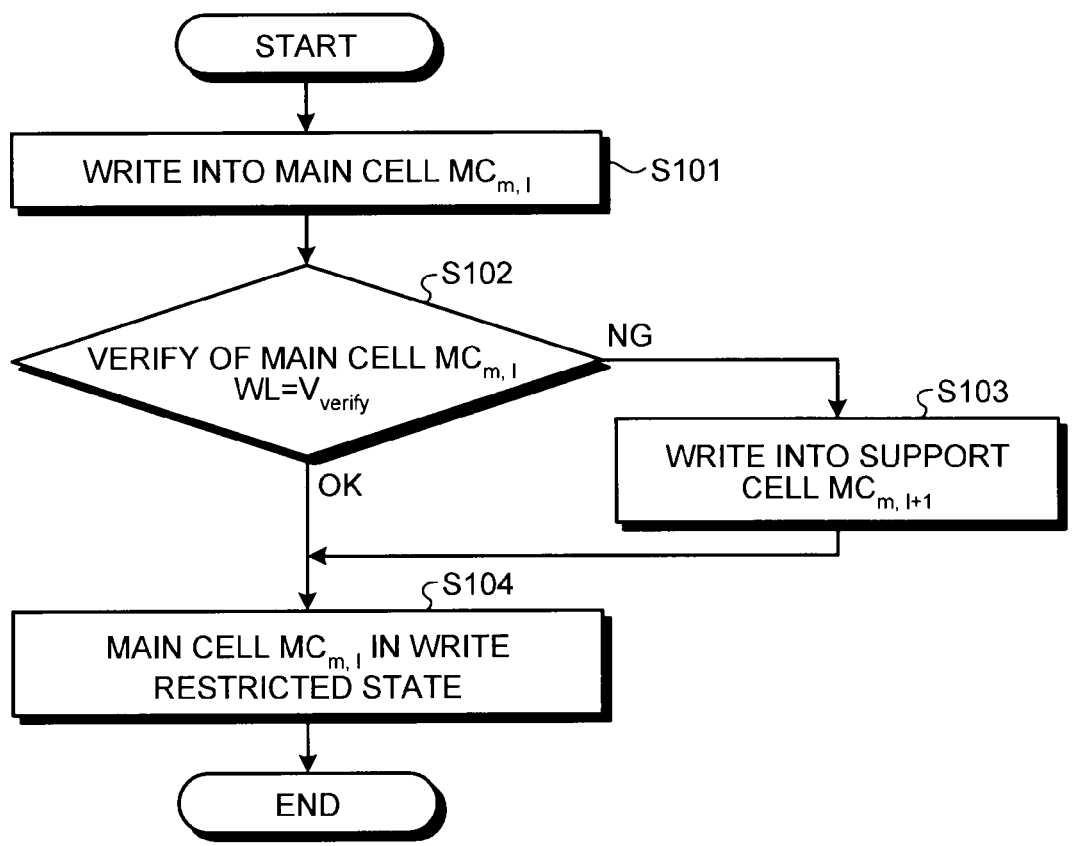
FIG. 10 is a flowchart illustrating a method for driving the nonvolatile semiconductor storage device according to the embodiment.

FIG. 10 is a flowchart of a method for driving the nonvolatile semiconductor storage device according to the embodiment. First, the word line drive unit $50_m$ writes data into the main cell $MC_{m,l}$ with the potential of the word line $WL_m$ as the write gate potential $V_{pgm}$ (step S101). Then, the data in the main cell $MC_{m,l}$ is read with the potential of the word line $WL_m$ as the verify read gate potential $V_{verify}$ (step S102). A very high gate potential $V_{read}$ is given to a non-select word line and a non-select transistor is ON. When the selected main cell $MC_{m,l}$ is powered on in this state, it is decided that the threshold of the main cell $MC_{m,l}$ is too low, that is, the write speed is low (step S102: NG). In this case, data is written into the support cell $MC_{m,l+1}$ (step S103). Thus, as illustrated in FIG. 6, the threshold of the main cell $MC_{m,l}$ is basically increased, a difference in write speed with other main cell with a high write speed is reduced when data is actually written. After step S103, and when the main cell $MC_{m,l}$ is off in step S102, that is, when the threshold reaches a desired value and the write speed is decided to be high (step S102: OK), the main cell $MC_{m,l}$ enters a write restricted state (step S104).

When the memory cell stores multivalues as in FIG. 6, it is considered the write amount into the support cell $MC_{m,l+1}$ can be controlled such that a variation distribution of the write speed (threshold) of the main cell is narrower as the write speed of the main cell $MC_{m,l}$ is lower, that is, the threshold is lower. As illustrated in the flowchart of FIG. 11, after data is written into the main memory cell $MC_{m,l}$ (step S111), the potential of the word line $WL_m$ may be changed to the three values $V_{verify}-\Delta V_{pgm}\times 2$, $V_{verify}-\Delta V_{pgm}\times 1$ and $V_{verify}$ for verify, thereby adjusting the write amount into the support cell.

In other words, for verify 1, the threshold (write speed) of the main cell $MC_{m,l}$ is decided with the potential of the word line $WL_m$ as $V_{verify}-\Delta V_{pgm}\times 2$ (step S112), and when the main cell $MC_{m,l}$ is powered on (step S112: NG), data is written such that the support cell $MC_{m,l+1}$ enters the "C" level (step S113).

When the main cell $MC_{m,l}$ is off in step S112 (step S112: OK), the processing proceeds to verify 2 to decide the threshold (write speed) of the main cell $MC_{m,l}$ with the potential of the word line $WL_m$ as $V_{verify}-\Delta V_{pgm}\times 1$ (step S114), and when the main cell $MC_{m,l}$ is powered on (step S114: NG), data is written such that the support cell $MC_{m,l+1}$ enters the "B" level (step S115).

When the main cell $MC_{m,l}$ is off in step S114 (step S114: OK), the processing proceeds to verify 3 to decide the threshold (write speed) of the main cell $MC_{m,l}$ with the potential of the word line $WL_m$ as $V_{verify}$ (step S116), and when the main cell $MC_{m,l}$ is on (step S116: NG), data is written such that the support cell $MC_{m,l+1}$ enters the "A" level (step S117).

When the main cell $MC_{m,l}$ is off in step S116 (step S116: OK), or after step S113, or after step S115, or after step S117, the main cell $MC_{m,l}$ enters a write restricted state (step S118).

The write into the support cell described in FIGS. 10 and 11 can be conducted as part of the block erase operation. In other words, as illustrated in the flowchart of FIG. 12, the block erase is performed on the block $11_i$ of FIG. 2, for example (step S121), data is then written into the main cell per word line for all the word lines (all the pages) in the block (step S122), all the main cells in the block are verified (step S123) and data is written into the support cell whose main cell has a low write speed as described in the flowcharts of FIGS. 10 and 11 (step S124). The processings are a series of block erase operation. Thereafter, data is actually written into the main cell (step S125).

For example, the control unit 100 illustrated in FIG. 4 controls the bit line drive units $C_{l-1}$, $C_l$, $C_{l+1}$, the bit line select units 51, 52, and the word line drive units $50_{m-1}$, $50_m$, $50_{m+1}$ to perform the method for driving the nonvolatile semiconductor storage device described above. Similar to the first embodiment, also in the embodiment, it is efficient that the bit line drive units connected to the bit lines $BL_l$ and $BL_{l+1}$ connected to the main cell $MC_{m,l}$ and the support cell $MC_{m,l+1}$, respectively, are shared as the bit line drive unit $D_1$ as illustrated in FIG. 9 to make the threshold correction on the main cell. Thereby, the hardware can be reduced in size.

In the embodiment, in the structure of the nonvolatile semiconductor storage device in which the paired cells are configured at non-uniform intervals as illustrated in FIG. 3, two adjacent memory cells are used with one for the main cell and the other for the support cell, thereby a distribution of variations in the main cell write speed (threshold) can be controlled to be narrower. Thus, the write speed can be enhanced. Therefore, the mechanism is used as part of the NAND nonvolatile semiconductor storage device and thus can be used as a cache memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device having:
   nonvolatile memory cells which are arranged in a matrix and are connected in series in a first direction; and
   word lines which connect control gates of the memory cells in a second direction perpendicular to the first direction,
   wherein a first interval and a second interval wider than the first interval are alternately repeated for intervals in the second direction between the memory cells,
   the nonvolatile semiconductor storage device comprising:
   a drive unit for writing data in a first memory cell, then writing data in a second memory cell which is connected to the same word line as the first memory cell and is spaced at the first interval in the second direction, then reading the data in the second memory cell, and reading the data in the first memory cell with correction based on the read value of the second memory cell.

2. The nonvolatile semiconductor storage device according to claim 1, wherein the nonvolatile memory cells can take two bits or more.

3. The nonvolatile semiconductor storage device according to claim 1, wherein the first memory cell and the second memory cell are connected to a common bit line drive unit.

4. The nonvolatile semiconductor storage device according to claim 3, wherein the bit line drive unit comprises a sense amplifier, a data latch circuit and a bit line driver.

5. The nonvolatile semiconductor storage device according to claim 1, wherein the nonvolatile memory cell has a floating gate.

6. A nonvolatile semiconductor storage device having:
   nonvolatile memory cells which are arranged in a matrix and are connected in series in a first direction; and word lines which connect control gates of the memory cells in a second direction perpendicular to the first direction, wherein a first interval and a second interval wider than the first interval are alternately repeated for intervals in the second direction between the memory cells, the nonvolatile semiconductor storage device comprising:

a drive unit for measuring a write speed of a main memory cell, and then writing data based on the measurement result in a support memory cell which is connected to the same word line as the main memory cell and is spaced at the first interval in the second direction.

7. The nonvolatile semiconductor storage device according to claim 6, wherein the nonvolatile memory cells can take two bits or more.

8. The nonvolatile semiconductor storage device according to claim 6, wherein the main memory cell and the support memory cell are connected to a common bit line drive unit.

9. The nonvolatile semiconductor storage device according to claim 8, wherein the bit line drive unit comprises a sense amplifier, a data latch circuit and a bit line driver.

10. The nonvolatile semiconductor storage device according to claim 6, wherein the nonvolatile memory cell has a floating gate.

11. The nonvolatile semiconductor storage device according to claim 6, wherein after erasing a block as erase unit having the memory cells connected to word lines and measuring a write speed of the main memory cell connected to the word line in the block, the drive unit writes data based on the measurement result in the support memory cell which is connected to the same word line as the main memory cell and is spaced at the first interval in the second direction.

12. A method for driving a nonvolatile semiconductor storage device, the nonvolatile semiconductor storage device having:

nonvolatile memory cells which are arranged in a matrix and are connected in series in a first direction; and word lines which connect control gates of the memory cells in a second direction perpendicular to the first direction, wherein a first interval and a second interval wider than the first interval are alternately repeated for intervals in the second direction between the memory cells, the method comprising:

writing data in a first memory cell;

thereafter, writing data in a second memory cell which is connected to the same word line as the first memory cell and is spaced at the first interval in the second direction;

thereafter, reading the data in the second memory cell; and reading the data in the first memory cell with correction based on the read value of the second memory cell.

13. The method for driving a nonvolatile semiconductor storage device according to claim 12, wherein the nonvolatile memory cells can take two bits or more.

14. The method for driving a nonvolatile semiconductor storage device according to claim 12, wherein the first memory cell and the second memory cell are connected to a common bit line drive unit.

15. The method for driving a nonvolatile semiconductor storage device according to claim 14, wherein the bit line drive unit comprises a sense amplifier, a data latch circuit and a bit line driver.

16. The method for driving a nonvolatile semiconductor storage device according to claim 12, wherein the nonvolatile memory cell has a floating gate.

* * * * *